(12) United States Patent
Van Keuren et al.

(10) Patent No.: US 10,374,198 B2
(45) Date of Patent: Aug. 6, 2019

(54) ELECTRONIC DEVICES WITH ORGANIC NANOPARTICLES

(71) Applicant: Georgetown University, Washington, DC (US)

(72) Inventors: Edward Van Keuren, Herndon, VA (US); George Burton, Highland, MD (US)

(73) Assignee: Georgetown University, Washington, DC (US)

( * ) Notice: Subject to any disclaimer, the term of this patent is extended or adjusted under 35 U.S.C. 154(b) by 0 days.

(21) Appl. No.: 15/038,658

(22) PCT Filed: Nov. 25, 2014

(86) PCT No.: PCT/US2014/067489
§ 371 (c)(1),
(2) Date: May 23, 2016

(87) PCT Pub. No.: WO2015/077792
PCT Pub. Date: May 28, 2015

(65) Prior Publication Data
US 2016/0301035 A1 Oct. 13, 2016

Related U.S. Application Data

(60) Provisional application No. 61/908,589, filed on Nov. 25, 2013.

(51) Int. Cl.
*H01L 51/52* (2006.01)
*H01L 51/05* (2006.01)
(Continued)

(52) U.S. Cl.
CPC ...... *H01L 51/5296* (2013.01); *H01L 51/0566* (2013.01); *H01L 51/5012* (2013.01);
(Continued)

(58) Field of Classification Search
CPC ............. H01L 51/5296; H01L 51/0566; H01L 51/0051
See application file for complete search history.

(56) References Cited

U.S. PATENT DOCUMENTS 5,629,530 A 5/1997 Brown et al.
8,455,865 B2 6/2013 Hsu
(Continued)

FOREIGN PATENT DOCUMENTS

CN 101100282 A * 1/2008
WO WO 2011/110664 9/2011

OTHER PUBLICATIONS

Van Keuren, E. and M. Nishida, "Synthesis of nanocomposite materials using the reprecipitation method" Computers, Materials & Continua (CMC), vol. 409, No. 1, pp. 61-77, 2010.*
(Continued)

*Primary Examiner* — Lex H Malsawma
*Assistant Examiner* — Laura M Dykes
(74) *Attorney, Agent, or Firm* — Klarquist Sparkman, LLP

(57) ABSTRACT

An organic field effect transistor includes a semiconductor substrate having an insulating layer and a source electrode and a drain electrode located on the insulating layer, where the source electrode and drain electrode are spaced apart and define a channel region. The organic field effect transistor also includes an organic semiconductor located in the channel region.

17 Claims, 10 Drawing Sheets

(51) Int. Cl.
*H01L 51/50* (2006.01)
*H01L 51/56* (2006.01)
*H01L 51/00* (2006.01)

(52) U.S. Cl.
CPC ............ *H01L 51/56* (2013.01); *H01L 51/002* (2013.01); *H01L 51/005* (2013.01); *H01L 51/0051* (2013.01); *H01L 51/0052* (2013.01); *H01L 51/0054* (2013.01); *H01L 51/0055* (2013.01); *H01L 51/0068* (2013.01)

(56) References Cited

U.S. PATENT DOCUMENTS

2005/0017237 A1* 1/2005 Ong .................... H01L 51/0044 257/40
2005/0266067 A1* 12/2005 Sengupta ............. A61K 9/1271 424/450
2008/0164460 A1* 7/2008 Oyamada ............ H01L 27/3244 257/40
2010/0283024 A1 11/2010 Yoshizumi
2012/0261648 A1* 10/2012 Wu ..................... H01L 51/0074 257/40

OTHER PUBLICATIONS

International Search Report and Written Opinion issued in corresponding PCT Application No. PCT/US2014/67480 (dated Feb. 24, 2015).

Shokaryev et al., "Electronic Band Structure of Tetracene—TCNQ and Perylene—TCNQ Compounds," *J. Phys. Chem. A*, vol. 112, pp. 2497-2502, Feb. 20, 2008.

* cited by examiner

US 10,374,198 B2

ELECTRONIC DEVICES WITH ORGANIC NANOPARTICLES

CROSS REFERENCE TO RELATED APPLICATIONS

This is the U.S. National Stage of International Application No. PCT/US2014/067480, filed Nov. 25, 2014, which was published in English under PCT Article 21(2), which in turn claims priority to U.S. Provisional Application No. 61/908,589, filed Nov. 25, 2013, which is incorporated herein by reference in its entirety.

FIELD

The present disclosure relates to organic charge transfer complexes for use in organic electronic devices.

BACKGROUND

Energy consumption is projected to double by 2050. With growing concerns for the current and future devastating effects of climate change, low carbon alternatives to fossil fuel technologies must play a larger role in the global energy mix, especially in developing countries such as China and India. Renewable energy technologies, which harness energy from natural resources such as the sun, wind, waves and geothermal heat, provided 19.5% of the world's total electricity in 2009.

The annual solar irradiance on the Earth exceeds the world's energy supply by several thousand times. However, technological feasibility impedes this reality. Conversion efficiencies of 39% for solar panels have been reached; however, commercially available panels usually have conversion efficiencies around 15-20%. Another difficulty with traditional inorganic solar cells is the high financial cost. Accordingly, improvements to these electronic devices are desirable.

SUMMARY

The present disclosure relates to organic charge transfer complexes for use in organic electronic devices, such as organic field effect transistors. In one representative embodiment, an organic field effect transistor comprises a semiconductor substrate having an insulating layer and a source electrode and a drain electrode located on the insulating layer, where the source electrode and drain electrode are spaced apart and define a channel region. The organic field effect transistor also comprises an organic semiconductor located in the channel region, the organic semiconductor comprising an organic charge transfer complex.

Another representative embodiment is an organic photovoltaic device doped with an organic charge transfer complex, the organic charge transfer complex comprising an electron donor particle and an electron acceptor particle, wherein the electron donor particle and the electron acceptor particle are configured as a nanoparticle co-crystal.

In another representative embodiment, a method of making an organic field effect transistor comprises providing a semiconductor substrate having an insulating layer thereon, depositing a source electrode and a drain electrode onto the insulating layer such that the source electrode and drain electrode define a channel region therebetween, and depositing an organic semiconductor layer in the channel region, the organic semiconductor comprising an organic charge transfer complex.

The foregoing and other objects, features, and advantages of the invention will become more apparent from the following detailed description, which proceeds with reference to the accompanying figures.

DETAILED DESCRIPTION

Figures 1, 2, 3A, 3B, 3C:
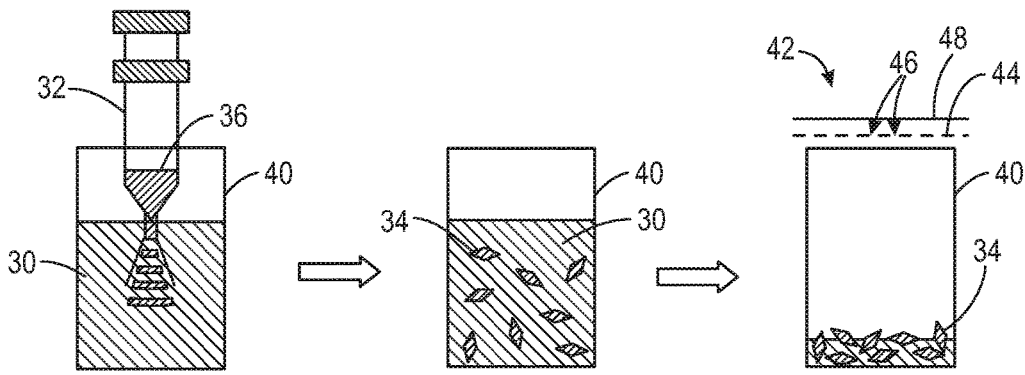
FIG. 1 is a table listing electron donor molecules with chemical formulae and molecular structure.
FIG. 2 is a table listing electron acceptor molecules with chemical formulae and molecular structure.
FIGS. 3A-3C schematically illustrate a method of making organic multicomponent nanoparticles by reprecipitation.

For purposes of this description, certain aspects, advantages, and novel features of the embodiments of this disclosure are described herein. The disclosed methods, apparatuses, and systems should not be construed as limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

Unless otherwise indicated, all numbers expressing quantities of components, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under standard test conditions/methods as understood by those of ordinary skill in the art. When directly and explicitly distinguishing embodiments from discussed prior art, the embodiment numbers are not approximates unless the word "about" is recited. Furthermore, not all alternatives recited herein are equivalents unless expressly stated otherwise.

Referring now to FIGS. 1-6, solar cells made with organic materials show promise not only in a large price reduction from low cost fabrication, but also for the ability to make flexible thin plastic films and the ease of disposability compared with their inorganic counterparts. Another advantage of organic photovoltaic (OPV) devices is the capability to change the chemical makeup of the organic materials used in the devices to tailor them for specific needs. While OPV devices have much smaller conversion efficiencies, there has been much improvement recently with the highest recorded efficiency to date being 8.3%. In order to create more efficient OPVs for commercialization, there must be extensive research in materials in physics, chemistry and engineering. This disclosure is directed to creating and characterizing, optically and electrically, electron donor and acceptor composite nanoparticles using the reprecipitation method for improving OPVs and other electronic devices such as organic field effect transistors. In some embodiments, characterizing the electron and hole mobilities through the charge transfer complex can be a first step in determining the viability of an organic material in organic devices such as OPVs.

Electron and hole mobilities in organic material can be measured using a Hall effect experiment. Another way to measure them can be through the creation of ambipolar organic field effect transistors (OFETs), which also have immediate applications to organic electronics. OFETs show much promise in advancing organic electronic components which, like Organic Photovoltaics, can be made at low cost into thin flexible films that can be environmentally disposed. Lateral patterning in trying to mimic complementary metal-oxide semiconductor (CMOS) integrated circuits in organic electronics can make device fabrication complex. Ambipolar OFETs can minimize complex fabrication processes and patterning for organic electronics without loss of performance. Therefore, OFETs allow for basic understanding of charge transport through a material and can be used to mimic CMOS-like organic electronics.

Additionally some organic semiconducting materials have capabilities as light emitting diodes. Using some materials, therefore, OFETs can also be Organic Light Emitting Field Effect Transistors (OLETs), which can provide information about charge recombination and light emission in organic materials. OLETs and other organic light emitting diodes have a large range of applications, including optical communication systems, advanced display technology, solid state lighting, and electrically pumped organic lasers. Finally, some organic charge transfer complexes have even shown characteristics leading to high temperature organic superconductors.

A variety of organic materials can be used for OPVs, OFETs, and OLETs, including organic charge transfer complexes. The nano-cocrystal charge transfer complex Perylene-TCNQ can be formed using the reprecipitation method. Perylene-TCNQ crystals created using the reprecipitation method have optical and electrical capabilities that can be used in electronic devices, both as dopants to increase charge mobility and transport and as the primary semiconducting material.

The synthesis of nanomaterials from solution at room temperature has progressed from single component to multicomponent multifunctional substances and can be used for a wide range of applications including biomedicine, electronics, and superconductivity. Molecular self-assembly and self-organization is the process by which many of these nanoparticles and nanomaterials are formed. The interactions (covalent, van der Waals, hydrogen, etc.) in these processes can be crucial to understanding and modifying the nanoparticles for a specific purpose. The particle formation is also affected by various environmental factors such as pH, temperature, and concentration. In some embodiments, the reprecipitation method can be used to create donor/acceptor nanoparticle blends.

One type of co-crystal nanoparticle that can be applied to OPVs and organic electronics is organic charge transfer salts or organic charge transfer complexes. An organic charge transfer complex is a combination of one or more electron or charge donor molecules and one or more charge acceptor molecules, either both organic or an organic/non-organic combination. Attraction of the electron donor and acceptor molecules to form an organic charge transfer complex can occur by a transition into an excited state. Since the excited state occurs routinely in the visible range, organic charge transfer complexes often exhibit strong colors. Absorption spectroscopy is a powerful tool to characterize the optical absorption bands, often called charge transfer bands, of the materials. Organic charge transfer complexes, as their name suggests, can exhibit a strong ability to transfer charge within the crystal. Additionally, some organic charge transfer complexes have strong electron and/or hole mobilities, and can easily separate hole and electron pairs.

Field Effect Transistors (FETs) are three-terminal devices with a conducting channel between a source and drain electrode. The amount of voltage applied to the gate electrode allows the user to control the amount of current that travels through the device. Typically FETs are made into metal-oxide-semiconductor (MOSFET) devices; however, recently there has been a push for less expensive organically based devices that are more environmentally friendly. In some embodiments, Organic Field Effect Transistors (OFETs) can use an organic semiconductor in the channel between the source and drain electrodes. Organic materials for use with these devices can include, for example, rubene and pre-oxidized pentacene, exhibiting mobilities as high as 20-40 $cm^2/(V*s)$, which can compete with amorphous silicon thin film transistor devices and approach the mobilities in poly-Silicon thin film transistors.

Ambipolar field-effect transistors (FETs) are desirable for organic semiconductors and organic electronics since OFET processing is simpler than mimicking CMOS-type electronics. For ambipolar OFETs, this means that both the electron and hole mobilities can be measured at the same time. Typical characteristics of ambipolar devices include diode-like current increases when $$|V_{ds}| >> |V_g - V_t| \quad (1)$$

where $V_{ds}$ is the drain to source voltage, and $V_g$ and $V_t$ are the gate and threshold voltages respectively, as well as current saturation at high gate voltages and a V-shape transfer curve when plotting $|I_{ds}|$ versus $V_g$. These characteristics can come from the injection of holes and electrons into a common channel.

Ambipolar OFETs can have charge carrier mobilities of $10^{-5}$ to 0.1 $cm^2$ $V^{-1}$ $s^{-1}$ and voltage gains of 6-18 when converted into inverters. Charge Transfer Complexes, as described above, can exhibit strong electron and/or hole mobilities through the material, and can be useful in ambipolar OFETs.

In photovoltaic devices, electromagnetic radiation of short wavelength and high frequency, where $hf > E_g$, can be absorbed by the semiconductor material (e.g., an organic substrate), which can result in the photoexcitation of electrons and the creation of holes. When light hits the organic polymer of an organic solar cell, electrons can be excited to the Lowest Unoccupied Molecular Orbit (LUMO), which can leave holes in the Highest Occupied Molecular Orbit (HOMO). In a single layer OPV, an electric field is produced by the different work functions of the electrodes to achieve charge separation. In a bilayer, in which there are layers of electron donor and electron acceptor polymers, or in bulk heterojunction OPVs, in which the donor and acceptor polymers are blended, the difference in donor and acceptor electric fields separates the exciton pairs. In all three OPVs, as the potential separates the exciton pairs, the charge is carried through the material, creating current.

Increasing charge transfer through the organic polymer material of organic solar cells can greatly improve its efficiency, since the charge carrier mobility of organic compounds can be much lower than the inorganic counterparts and the interaction of the electron hole pair that results in diffusion as uncharged particles. Organic charge transfer complexes, with their high charge carrier mobility and charge transfer, can be used to optimize current OPV designs. Doping OPVs with organic charge transfer complexes can enhance their charge mobility and transfer, and can make devices such as organic solar cells more efficient. Additionally, the organic charge transfer complexes disclosed herein can act as stand-alone OPVs, being both the exciton/hole separator and the electron/hole transfer material.

Charge Transfer Complex Preparation

The electron donor and electron acceptor molecules disclosed herein are listed in the tables of FIG. 1 and FIG. 2. For donor compounds, perylene, anthracene, tetracene and tetrathiafulvalene (TTF) can be used, as shown in FIG. 1. For acceptor compounds, Tetracyanoquinodimethane (TCNQ) and Tetracyanoethylene (TCNE) can be used, as shown in FIG. 2. The scope of this disclosure includes all eight combinations of donor/acceptor molecules, which can be organic charge transfer complexes configured as multi-component organic nanoparticles or co-crystals of varying size.

In some embodiments, perylene-TCNQ co-crystals can be formed using the reprecipitation technique. When perylene crystallizes with a molecule of the cyano family (—CN), of which both acceptor molecules TCNQ and TCNE are a part, the crystal can exhibit high electron and hole mobilities, while tetracene-TCNQ can have slightly lower mobilities. This can be beneficial for their use in electronic devices.

The reprecipitation method is a process in which nanoparticle nucleation and growth is induced by the rapid injection of a molecular solution into a miscible non-solvent. The reprecipitation method can be used for multicomponent organic nanoparticle synthesis. A schematic representation of the process is shown in FIGS. 3A-3C. In the case of multicomponent organic nanoparticle synthesis with the reprecipitation method, compounds can be mixed in solutions such as acetone or ethanol. After mixing the two or more solutions at a specified ratio, the combined solution 36 can be injected into a non-solvent 30, such as water, with an injecting apparatus 32, as shown in FIG. 3A. To avoid mixing with the non-solvent, the compounds aggregate in the solution to create multicomponent organic nanoparticles 34, as shown schematically in FIG. 3B. In some embodiments, analysis of multicomponent organic nanoparticles using the reprecipitation technique can involve the interactions of all compounds as well as the solvents.

In one example, solutions of electron donor and acceptor molecules (e.g., perylene and TCNQ) can be prepared in acetone with concentrations of 2.5 mM. In some embodiments, tetracene may not dissolve in acetone very easily and, therefore, can be prepared at 0.3 mM (along with a TCNQ solution at the same concentration). The molecular solutions in acetone can be mixed using a microsyringe in a beaker at equimolar concentrations. The mixed acetone solution can then be injected using the injecting apparatus 32 (e.g., a microsyringe) into the non-solvent 30 (e.g., distilled or filtered deionized water) at a ratio of 1:9 (acetone solution to water) as shown in FIG. 3A, although other ratios can be used. The perylene and TCNQ molecules can then combine to create multicomponent organic nanoparticles 34, the size of which can depend on, for example, the concentration of electron donor and acceptor molecules in the solution, the temperature of the solution, and the length of time the nanoparticles are allowed to grow. In some embodiments, single component acetone solution nanoparticles can be assembled using the same technique for comparison. The organic compounds TCNE and TTF react highly in air and water and, therefore, can be prepared and/or have their absorption spectra measured while under a nitrogen atmosphere in a glove box.

If the powder form of the nanoparticles is desired, (for example, perylene-TCNQ), the container 40 can be submerged in liquid nitrogen after a period of time to allow for nanoparticle growth (e.g., 30 min). This process allows an almost immediate freezing of the solution, and can relatively quickly stop nanoparticle growth. The container 40 can then be placed in, for example, a Virtis Vacuum lyophilizer at −70 degrees Celsius, and freeze-dried until most of the water is evaporated, as shown in FIG. 3C. In some embodiments, some water weight is allowable. In some embodiments, smaller volumes (e.g., 30-50 mL) of solution can have better results due to complications of condensation on the refrigerator coil and the out-gassing of the particles during long operating times. The sample can be covered with PARAFILM® brand film 42, one layer 44 with holes 46 and another layer 48 to catch particles ejected during rapid out-gassing. Samples are usually ready within a week. In some embodiments, the optical absorption bands of samples can change over time, so new samples can be prepared in acetone before reprecipitating and freeze drying.

Optical Characterization

To determine if a co-crystal charge transfer complex nanoparticle is indeed forming, a number of optical characterization techniques can be utilized. Absorption Spectroscopy can be particularly useful to determine co-crystal structure in organic charge transfer complexes because of the combined unique properties that are shown in the formation of new absorption bands. Dynamic light scattering (DLS) can also be used to verify co-crystal formation and particle growth.

Absorption spectroscopy measures the amount of light absorbed by a sample at a variety of wavelengths. White light is emitted by a light source (e.g., an Ocean Optics light source) which can be collimated by a monochromator, and absorbed by the sample. The amount of light transmitted through the sample travels through an optical fiber to a mini spectrophotometer (such as an Ocean Optics CHEM2000-UV-VIS mini spectrophotometer), which can measure the intensity of light transmitted through the sample between the wavelengths of, for example, from about 350 nm to about 1000 nm. The dark noise and a reference sample (e.g., acetone and/or water at the same ratio as the ratio being measured) can be measured prior to taking data. A computer program, such as SpectraSuite by Ocean Optics, can take the measured intensity of dark noise and the reference sample and subtract them from the intensity of light through the sample to calculate the amount of light absorbed by the sample, since $$A_\lambda = -\log_{10}(I_1/I_0) \qquad (2)$$

where $A_\lambda$ is the absorbance at a certain wavelength of light, $\lambda$, $I_1$ is the intensity of light that passed through the sample, and $I_0$ is the incident radiation. To normalize data according to their concentrations, the Beer-Lambert equation can be used. The Beer-Lambert equation states that $$A = \epsilon C L \qquad (3)$$

where A is the absorption, $\epsilon$ is the molar absorptivity, C is the concentration, and L is length of sample the light passes through, or the path length. Using the Beer-Lambert equation, the molar absorptivity can be calculated. The molar absorptivity can also be graphed with respect to wavelength for different ratios and concentrations because it accounts for the concentration of the samples.

For the Near Infrared Absorption Spectroscopy measurements, a spectrometer that measures the intensity of light for wavelengths of from about 900 nm to about 1700 nm (e.g., a BWTEK Sol 1.7 TE Cooled InGaAs Array Spectrometer) can be used.

Dynamic Light Scattering (DLS) can be used to determine particle size as a function of time and to track particle formation and growth. Since the nanoparticles are suspended in solution (e.g., water), they can be subjected to Brownian motion. A 10 mW HeNe laser (e.g., a JDS Uniphase 1202-1) can excite the sample in solution, and an avalanche photodiode detector (e.g., a Perkin Elmer SPCM CD2882) can measure the intensity of scattered light at an arbitrary angle, such as 90 degrees. In order to find the particle size, the autocorrelation function can be calculated from the intensity of scattered light. The autocorrelation function is a measure of the correlation of the intensity of the scattered wave of light over time. The normalized field autocorrelation function, which is a function of the delayed time, τ, is defined as $$G_1(\tau) = e^{-\Gamma \tau} \qquad (4)$$

where $\Gamma$ is the diffusion rate, which is defined by $$\Gamma = Dq^2 \qquad (5)$$

where D is the diffusion coefficient and q is the scattering vector. From the diffusion coefficient, the particle size can be determined. Since the particles disclosed herein can be approximated as spheres in a Newtonian fluid, the diffusion coefficient can be defined by the Stokes-Einstein relation, $$D = \kappa_B T / 6\pi \eta R \qquad (6)$$

where $\kappa_B$ is the Boltzmann constant, T is the absolute temperature, $\eta$ is the viscosity of the solvent, and R is the hydrodynamic radius of the particle measured. From the Stokes-Einstein relation, this technique can be used to measure the average particle size of organic charge transfer complexes over time and compare it to the average particle sizes of the individual component nanoparticles.

To test the particles' electrical properties, an OFET and a simple metal-semiconductor/polymer-metal on glass device can be made. The machines used to make both devices can include, for example a sputtering system (e.g., a CVC AST-601) to sputter gold, chromium, or aluminum, and a photo resist spinner (e.g., aPWM32) to spin either photoresist, hexamethyldisilazane (HMDS), or the semiconducting nanoparticles in a polymer. In a representative embodiment, the mixture can contain a 1:1 ratio of perylene-TCNQ to polyvinylpyrrolidone, and for every gram of nanoparticles and gram of polyvinylpyrrolidone, there can be be 5 mL of de-ionized water. To take the field effect and conductivity measurements, a probe station can be used. The probe station can include, for example, a computer with a NI pci-6221 M-series DAQ card, an SCB breakout box, a high stability pre-amp, a voltage sweeper, and associated processor-executable instructions (e.g., a LabView® program).

OFET Fabrication

Figure 4:
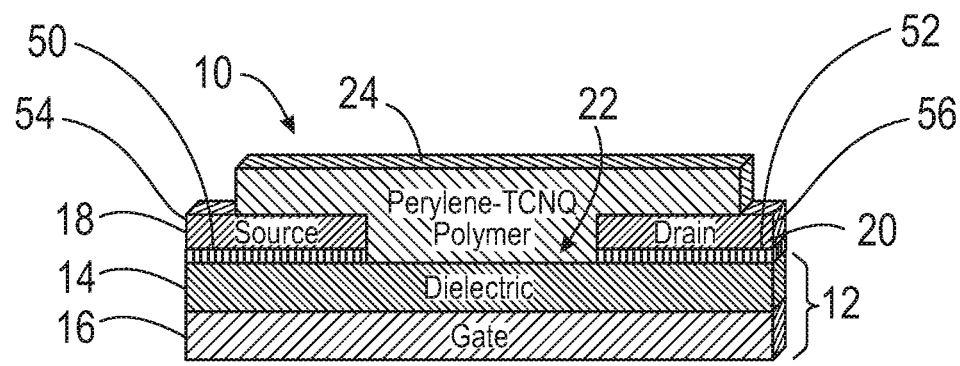
FIG. 4 is a plan view of a photomask design for an organic field effect transistor.
Figure 5:
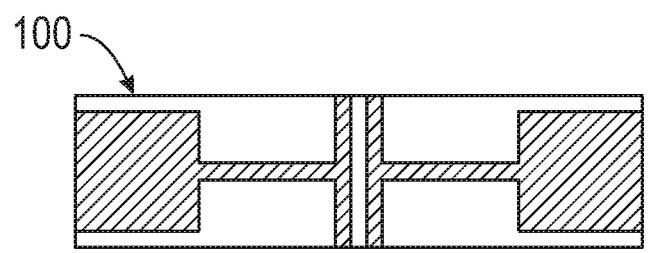
FIG. 5 is a schematic diagram of an organic field effect transistor.

In a representative embodiment, an organic field effect transistor (OFET) can be a bottom gate type OFET 10, as shown in FIG. 4. The OFET 10 can comprise a silicon substrate 12 having a dielectric layer 14 (i.e., an insulating layer) thereon, and which can be configured to function as a gate electrode 16. The OFET 10 can also comprise source and drain electrodes 18, 20. The silicon substrate 12 can be highly p-doped, and can have nominal resistivities of from about 0.001 to about 0.005 Ω-cm. Alternatively, the silicon substrate 12 can be n-doped. The dielectric layer 14 can be a thermally grown oxide layer on the silicon substrate 12 and can have a thickness of about 200 nm. The source and drain electrodes 18, 20 can comprise gold layers having a thickness of about 60 nm, and chromium adhesive layers having a thickness of about 2 nm. The source and drain electrodes 18, 20 can be spaced apart and can define a channel region 22 therebetween.

An organic charge transfer complex 24 can be deposited in the channel region 22, and can extend over the top surfaces of the source and drain electrodes 18, 20, as shown in FIG. 4. In some embodiments, the organic charge transfer complex 24 can include multicomponent organic nanoparticles comprised of perylene-TCNQ. In some embodiments, the organic charge transfer complex 24 can include multicomponent organic nanoparticles comprised of any combination of electron donor compounds and electron acceptor compounds disclosed herein. In some embodiments, source and drain electrodes 18, 20 can be patterned using standard photolithography, sputtering, and/or liftoff processes, as further described below. In alternative embodiments, the organic field effect transistor 10 can be configured as a top gate transistor, a dual gate transistor, a multi-gate transistor, etc., as desired.

Turning now to methods of making organic field effect transistors such as the OFET 10, the silicon wafer 12 can first be cut into 1 cm by 1.5 cm chips using, for example, a diamond scribe. After a piranha clean, a thin layer of HMDS can be spun (5 seconds at 500 rpm and 30 seconds at 3000 rpm) onto the chips. The HMDS can act as an organic adhesion layer for the photoresist. Next, positive photoresist, such as Shipley S1813 positive photoresist, can be spun with the same recipe and prebaked for 60 seconds at 110° C. The chips can then be exposed (e.g., for 10 seconds using a Karl Suss UV Intensity Meter Model 1000 machine) through a photomask 100 shown in FIG. 5. Dimensions for the channel length can be varied from, for example about 30 µm to about 200 µm, and the width can be fixed at 1 mm, although the OFET 10 can have any suitable channel length and/or width.

The chips can then be developed (e.g., using CD-30) for about 30 seconds and inspected under a microscope. The chips can then be hard baked for, e.g., 30 min at about 120° C., although the chips can be baked for any suitable length of time at any suitable temperature. Access to the gate electrode 16 can then be created by, for example, scratching through the photoresist and oxide layer 14 at the corner of the chip. Next, chromium adhesion layers 50, 52 and gold layers 54, 56 can be deposited to form the source and drain electrodes 18, 20. In some embodiments, the chromium adhesion layers 50, 52 can have a thickness of about 2 nm, and the gold layers 54, 56 can have a thickness of about 60 nm. The chromium and gold layers can be deposited by, for example, sputtering, although any suitable method of thin film deposition can be used.

The chips can then be placed in a solvent, such as acetone, to lift the metal off the chip, leaving only gold and chromium for the source and drain electrodes 18, 20, and gate electrode 16. Finally the perylene-TCNQ polymer in water can be spun onto the device 10, while covering the gate 16 and surrounding area with kapton tape, and placed, for example, in a dessicator jar overnight before taking electrical measurements. The thickness of the organic semiconductor layer can be measured using, for example, a Dektak.

Figure 6:
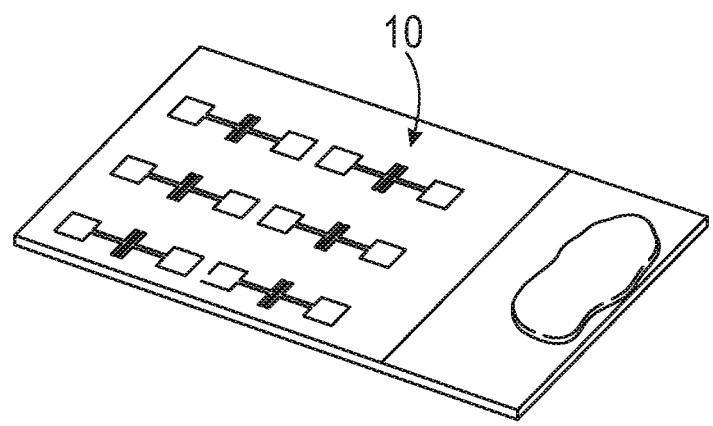
FIG. 6 is a top view of a plurality of organic field effect transistors.

A plurality of completed OFETs 10 are shown in FIG. 6. Charge carrier mobilities can be calculated using the standard equation for the saturation region current for metal-oxide-semiconductor field effect transistors:

$$I_{ds} = \mu W C_{ox}/2L(V_g - V_t)^2 \quad (7)$$

where $I_{ds}$ is the current from drain to source, µ is the mobility, W is the channel width, $C_{ox}$ is the capacitance of the oxide layer, and L is the channel length. The capacitance of the oxide layer is calculated by $$C_{ox} = A\epsilon_o/t_{ox} \quad (8)$$

where A is the area of the capacitor, $\epsilon_o$ is the permativity of free space and $t_{ox}$ is the thickness of the oxide.

Measurements to determine the sample's conductivity (and eventually the photoconductivity) allow for a better understanding of the nanoparticle's application to OPVs and other semiconducting devices. To determine the conductivity and photoconductivity of samples, the particles can be spin coated onto microscope slides. In a representative embodiment, the solution can spin coat for 35 seconds at 1000 rpm with a slow spread at the beginning for 5 seconds. This recipe can allow for an even spread across the entire microscope slide. After the nanoparticles have been spin-coated, the height of the spun material can be measured using surface profilometer, such as a Dektak 3030 Surface Profilometer. Samples can be evenly spread, and can have a height of about 7500 Å. The height of the microscope slide can be determined by, e.g., covering the end of the microscope slide with a piece of tape.

The conductivity of the charge transfer complex can show how strongly the sample allows the flow of current, which can determine the charge mobility in the material. Large particular spacing may inhibit the flow of current through the sample. In some embodiments, aluminum can be sputtered on microscope slides, followed by the spun cast sample, and by another 2 kÅ of aluminum. A probe can be placed on each aluminum probe pad to measure the voltage difference when a current is applied. In some embodiments, sputtering directly onto a charge transfer complex polymer can be a source of measurement variability.

After measuring the I-V curves, the resistivity of the sample can be calculated using the equation:

$$\rho = (R*A)/l \quad (9)$$

where R is the resistance (the slope of the I-V curve), A is the cross sectional area and l is the length of the sample. Thus, the conductivity of the sample can be expressed as:

$$\sigma = 1/\rho \quad (10)$$

Figure 22:
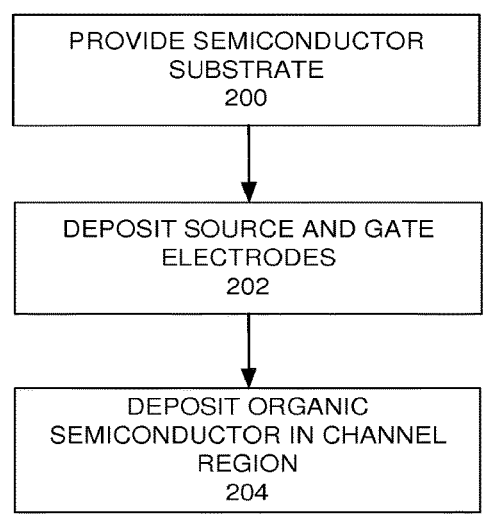
FIG. 22 is a block diagram illustrating a representative method of making an organic field effect transistor.

A representative method of making an organic field effect transistor is illustrated in FIG. 22. A semiconductor substrate having an insulating layer thereon can be provided at block 200. The semiconductor substrate can be, for example, a silicon-based material, and can be p-doped or n-doped, as desired. At block 202, source and drain electrodes can be deposited on the insulating layer such that the source electrode and the drain electrode define a channel region therebetween. At block 204, an organic semiconductor layer can be deposited in the channel region. The organic semiconductor can comprise an organic charge transfer complex such as perylene-TCNQ, and/or any other organic charge transfer complex disclosed herein. In some embodiments, the organic charge transfer complex can be configured as multicomponent organic nanoparticles or co-crystals.

Example 1: Perylene-TCNO

Figure 7:
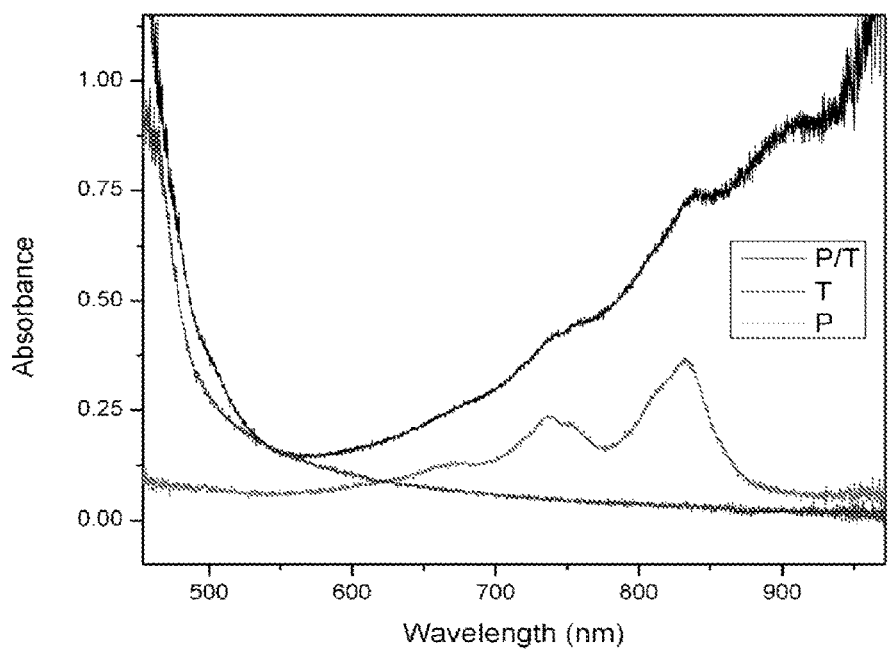
FIG. 7 is a plot of the UV-Vis absorption spectra of perylene and TCNQ separately and together at a ratio of 1:9 with distilled water.

In a first example, the absorption spectrum was measured for a 1:9 ratio of Perylene-TCNQ to distilled water to test for co-crystallization. The results are shown in FIG. 7. The absorption spectra for perylene-TCNQ at the 1:9 ratio show a new peak around 900 nm, which confirms co-crystallization. While the charge transfer absorption spectrum does have peaks resembling both perylene and TCNQ individual spectra, the large peak in the near infrared is new. The large absorption peak in the Near Infrared cannot be seen using the UV-Vis spectrometer. Approaching the near infrared wavelengths, the sensitivity of the UV-vis spectrometer can be low and, therefore, the data is noisy. The results using the Near Infrared Spectrometer are shown in FIG. 9 and are described in detail below.

Figure 8:
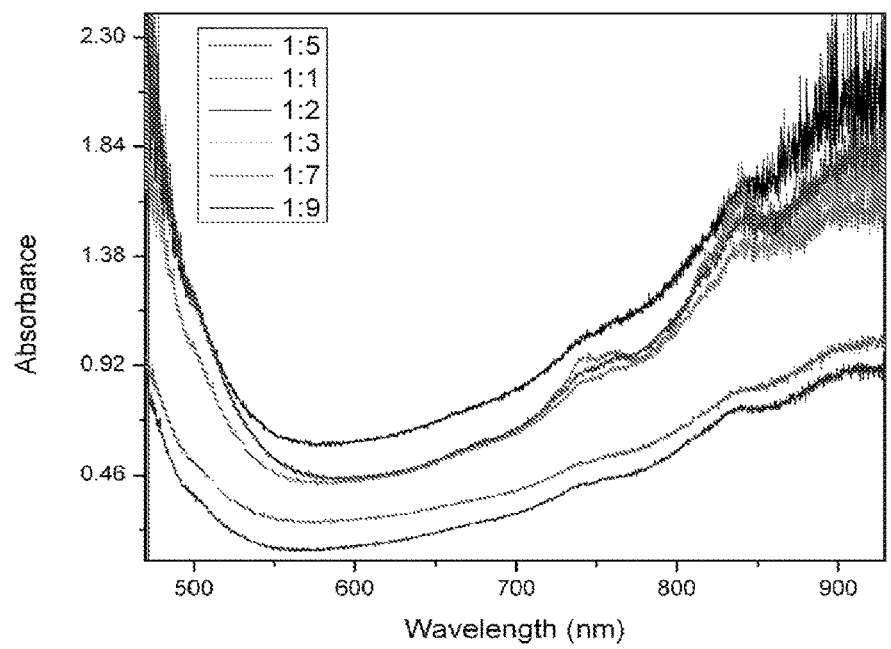
FIG. 8 is a plot of the UV-Vis absorption spectra of perylene-TCNQ in distilled water.

The large absorption in the near infrared region can mean that the organic nanoparticle co-crystal has a lower band gap in the near infrared, meaning less energy is needed to promote electrons to the conduction band. For the 900 nm peak of Perylene-TCNQ, $E_g$ is approximately equal to 1.34 eV, since $E_g=1240/\lambda$, where $\lambda$ is the wavelength. Low band gap materials generally have higher efficiencies in photovoltaic devices and can mean that the material will be sufficiently conductive. The infrared region of the solar irradiance is low compared to the UV and visible range. The large absorption peak is in the infrared, indicating that the perylene-TCNQ co-crystal may likely work better as a dopant to increase electron and hole mobility in another organic material for use in organic photovoltaic devices, rather than as the sole semiconducting material for the device. Additionally, various ratios of perylene-TCNQ to distilled water from 1:9 to 3:1 are measured. Referring to FIG. 8, there is a peak around 900 nm for all ratios between 1:9 and 1:1. The 1:5 ratio has the highest peak and the 1:9 and 1:7 ratios have the lowest peaks. The 2:1 and 3:1 ratios are not shown, since all light was absorbed (i.e., the solution was opaque). Large particles were likely forming in solution. Therefore, in some embodiments, the desired co-crystal and co-crystal size can form for the ratios of acetone solution to water of about 1:2 and 1:1.

Figure 9:
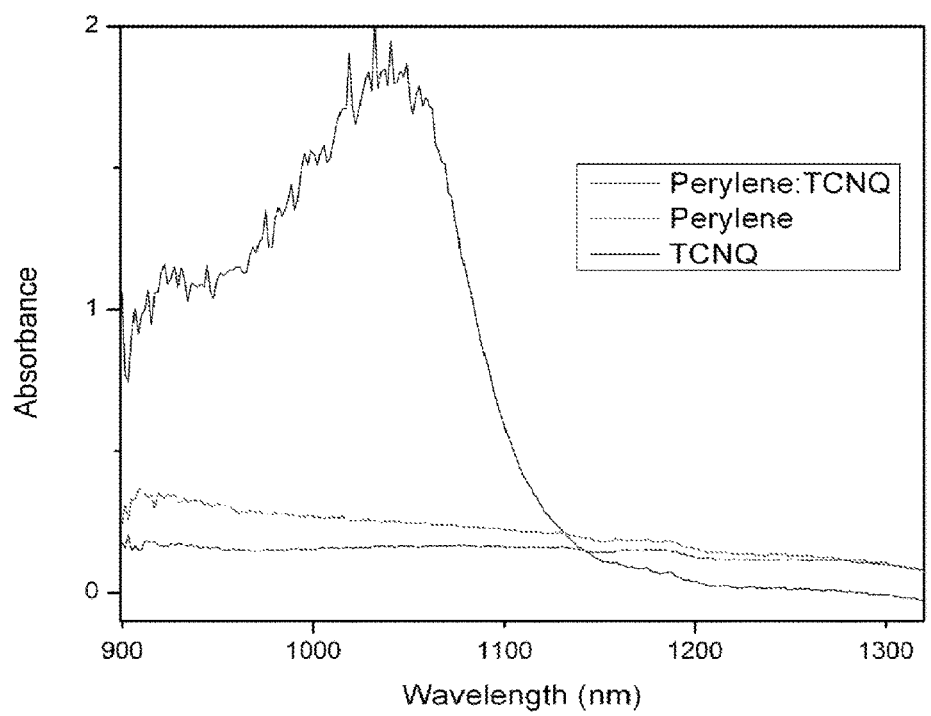
FIG. 9 is a plot of the near-infrared absorption spectra of perylene-TCNQ and perylene and TCNQ at a ratio of 1:9 with distilled water.

Using Near Infrared Spectroscopy, the charge transfer peak can be seen at a wavelength just over 900 nm for the 1:9 ratio of perylene-TCNQ and filtered deionized water, as shown in FIG. 9. This again confirms that a co-crystal is likely forming, since no such peak exists in the perylene or TCNQ individual solutions. A new absorption peak, such as the one for Perylene-TCNQ, can mean that the chemical structure of the compound has changed. Also, another peak around 1040 nm is found, giving additional confirmation of nanoparticle formation, as well as providing more evidence that the charge transfer complex of perylene-TCNQ should work well as an organic semiconductor material. Ratios of perylene-TCNQ to water of from about 1:9 to about 1:1 were tested, as done previously with the UV-Vis spectrometer.

Figure 10:
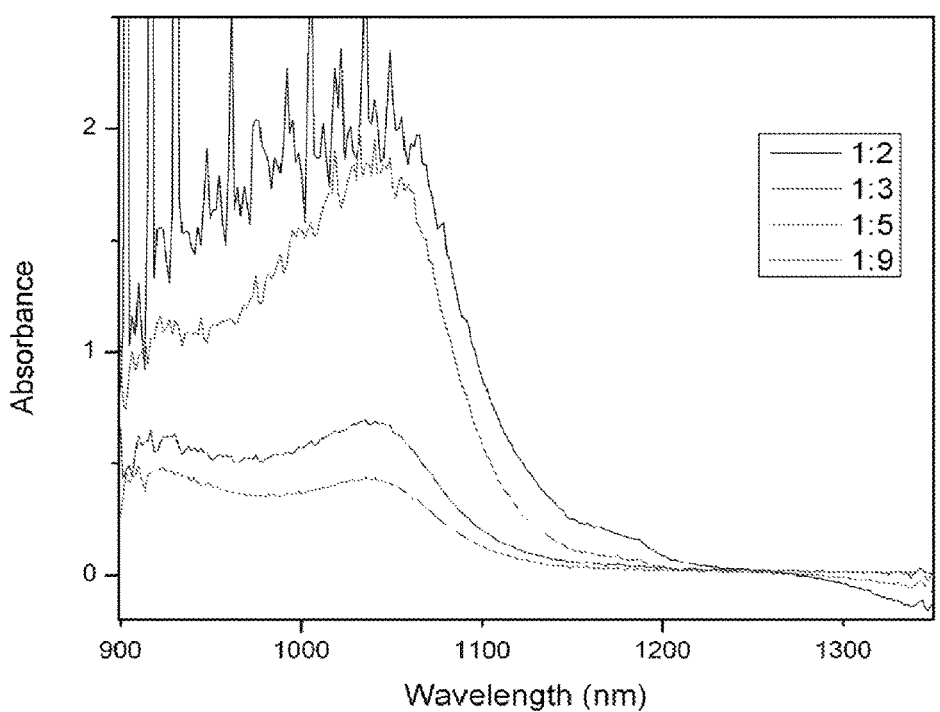
FIG. 10 is a plot of the near-infrared absorption spectra of Perylene-TCNQ at various ratios.

In FIG. 10, the absorption spectra of the various ratios are compared. The 1:1 ratio is excluded from the graph, again because of the background created by the opacity of the solution. The charge transfer peaks are shown to increase as the concentration of acetone increases. The larger absorption band at longer wavelengths can mean a lower band gap and possibly better conductivity than the 1:9 ratio. However, the strength of absorption can also indicate that more crystals are forming. Therefore, using concentrations above 1:9 can be beneficial.

Figure 11:
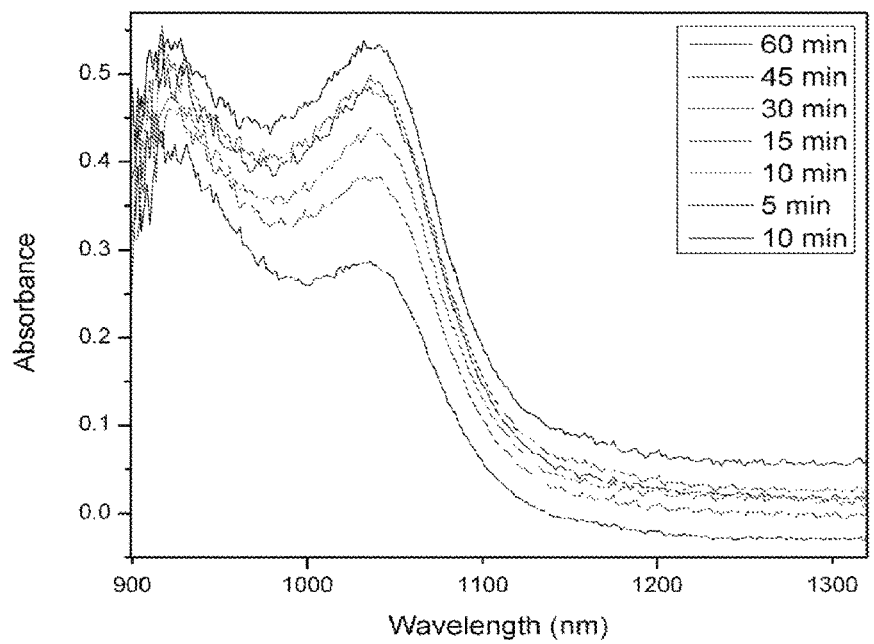
FIG. 11 is a plot of the near-infrared absorption spectra of perylene-TCNQ with water at a ratio of 1:9 with respect to time.

The higher absorption band can mean that a different form of the co-crystal nanoparticle is forming. The higher absorption band can also be seen with P3T1, where three perylene molecules link to one TCNQ. The solubility of perylene in acetone is less than the solubility of TCNQ in acetone, and the solubility of both decreases with increased amounts of acetone. As the ratio of acetone to water increases, less TCNQ can fall out of solution to form a compound such as P1T1, and is forced to form a different form of the crystal, P3T1. Absorption spectra of a 1:9 ratio of perylene-TCNQ to water over a one hour period was also investigated. The results are shown in FIG. 11. Over time, both charge transfer peaks grew, most likely due to background accumulation and possibly the stabilization of the particles, since nanoparticle size can stabilize after about 30 minutes.

Figure 12:
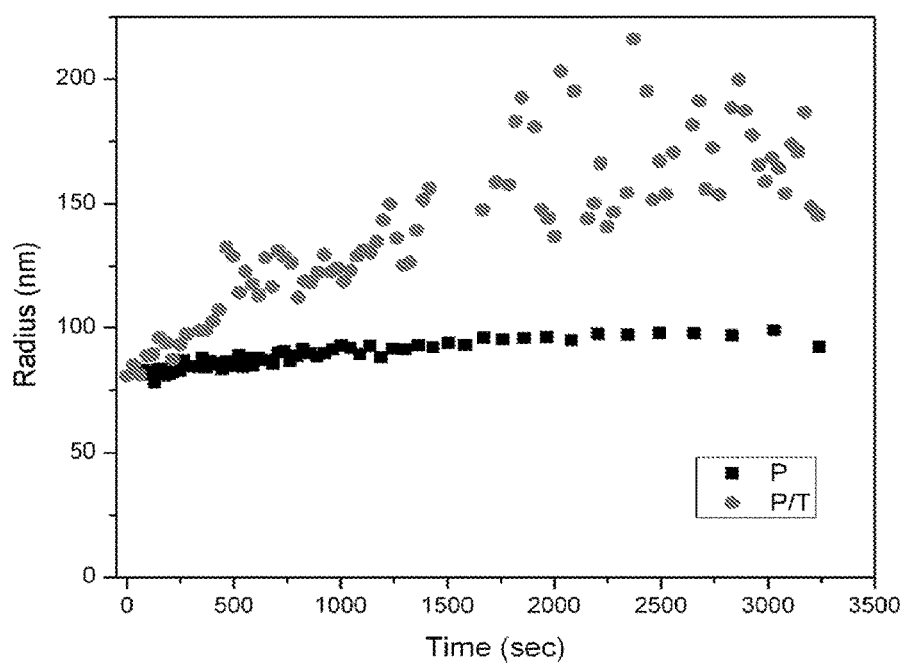
FIG. 12 is a plot of the radius of perylene and perylene-TCNQ particles in distilled water with respect to time.
Figure 13:
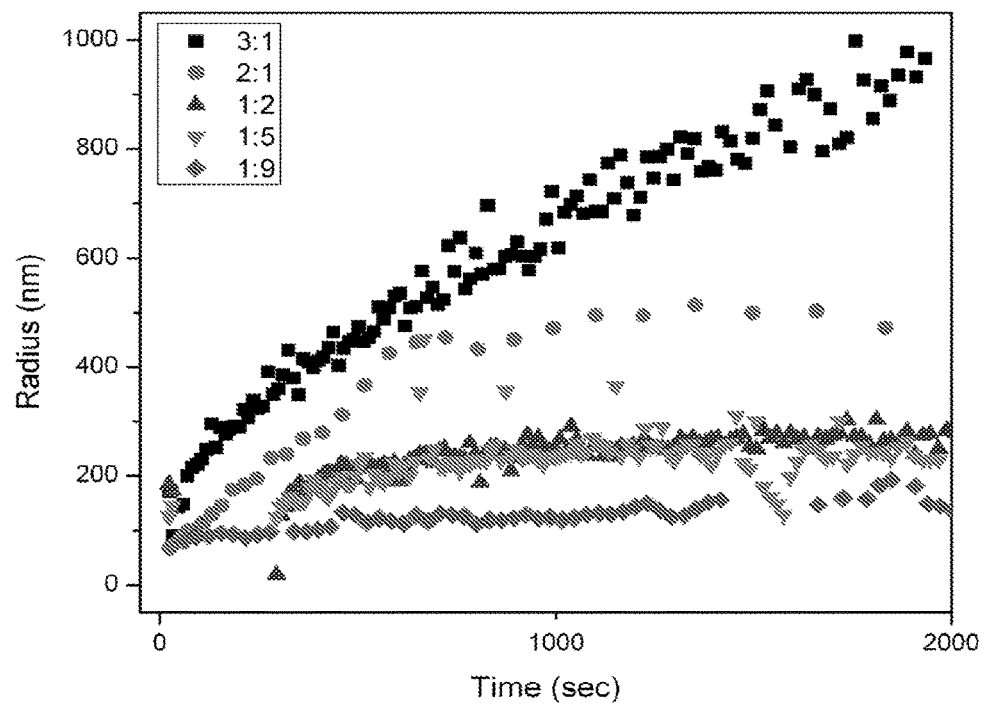
FIG. 13 is a plot of the radius of perylene-TCNQ particles in distilled water with ratios of from 1:9 to 3:1.

DLS measurements of Perylene-TCNQ can further confirm organic co-crystal formation. FIG. 12 shows the comparison of particle size between Perylene only, whose radius stabilizes around 90 nm after an hour, and Perylene-TCNQ with an average radius stabilized at 170 nm after an hour. This can indicate that an organic co-crystal is forming since TCNQ by itself is known to form larger particles of around 350 nm. FIG. 13 shows a graph of the radius of various ratios of Perylene-TCNQ to water, from 1:9 to 3:1. A steady increase in particle growth is observed as the concentration of acetone increases. This phenomenon is also linked to the solubility parameters of Perylene-TCNQ in acetone with water. As the concentrations of acetone increases, fewer particles are able to fall out of solution. There can be fewer nucleation sites, but more room for growth into larger crystals. At smaller concentrations, there can be a multitude of nucleation sites, and particles can form quickly, which can result in smaller particle size. In some embodiments, the radius of the nanoparticles at a high concentration continuously increases and does not level off after an hour. For the ratios from 1:9 to 1:1, there can be a small increase in average radius of the particles. For the 1:9 ratio, the average radius levels off at 150 nm; for the 1:7 ratio, at 200 nm; for the 1:5 and the 1:3 ratios at 250 nm; and for the 1:2 and the 1:1 ratios at 275 nm, as shown in FIG. 13. In some embodiments, there may be a correlation between particle radius and the ratio of acetone solution to water.

In order to verify that the P3T1 crystal forms at higher concentrations of acetone for Perylene-TCNQ, x-ray diffraction can be performed as well as Raman Spectroscopy. Additional tests on perylene-TCNQ devices can include photoconductivity, photoluminescence, and organic photovoltaic measurements, as well as Raman spectroscopy, Powder X-ray diffraction, SEM, and electrical testing.

Example 2: Anthracene-TCNQ

Figure 14:
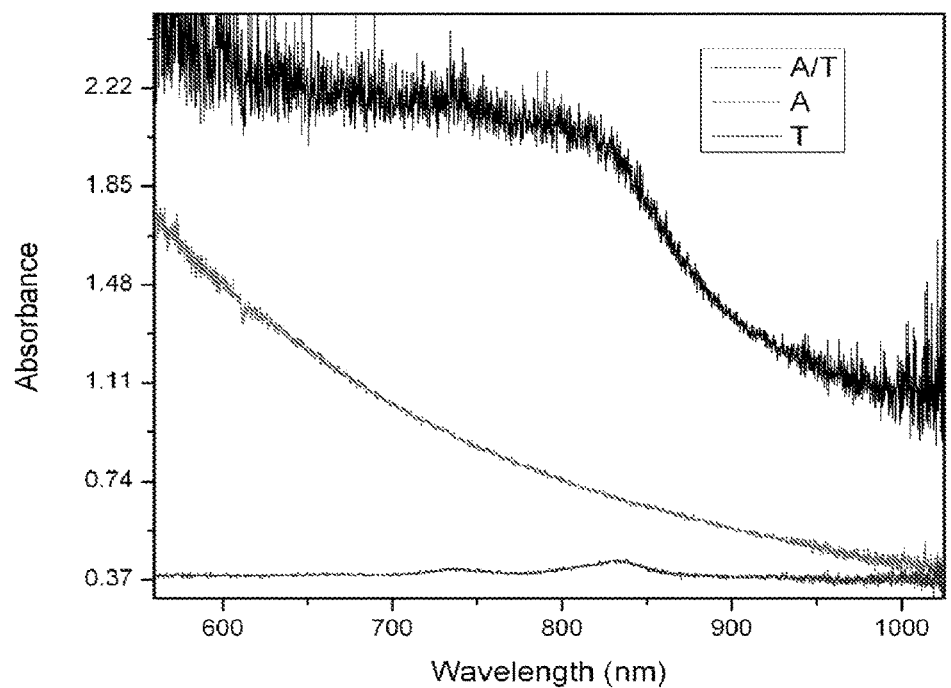
FIG. 14 is a plot of the absorption spectra of Anthracene-TCNQ at a concentration of 7.5 mM and a ratio of 1:9 with water.
Figure 15:
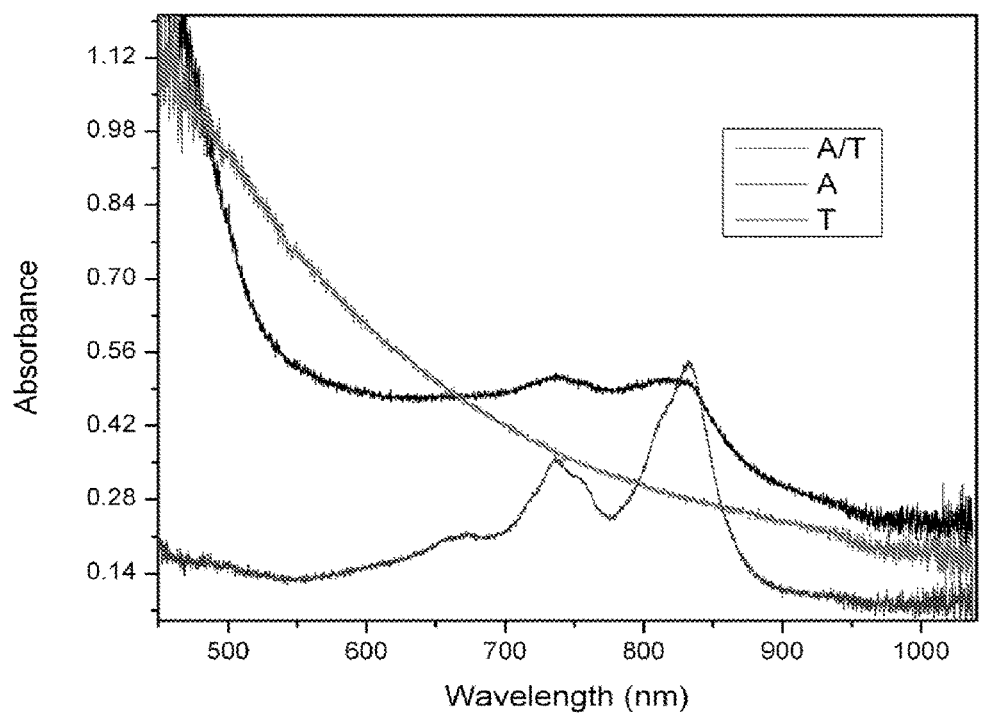
FIG. 15 is a plot of the absorption spectra of Anthracene-TCNQ at a concentration of 2.5 mM and a ratio of 1:9 with distilled water.

In a second example, Anthracene-TCNQ was optically tested using the reprecipitation method to see if organic co-crystal charge transfer complex nanoparticles could be formed for use in electronic devices. Anthracene-TCNQ was tested at 2.5 mM concentrations at ratios of 1:9 and 1:4 with distilled water, at 7.5 mM concentrations at a 1:9 ratio with distilled water, and a combination of 2.5 and 7.5 mM concentrations at 1:9 ratios with distilled water. Generally, the absorption spectra of the combined anthracene-TCNQ and acetone mixture in water does not show any new peaks. The absorption peaks of the combined acetone mixture can be the combination of the absorption peaks of the acetone solutions separately. However, the absorption spectrum of anthracene-TCNQ both at 7.5 mM has a peak around 800 nm (see FIG. 7) and there could possibly be a peak in the near infrared region, however NIR spectroscopy confirmed that there is not one. FIGS. 14 and 15 show the UV-Vis absorption spectra of anthracene-TCNQ at 7.5 mM and 2.5 mM concentrations, respectively.

Figure 16:
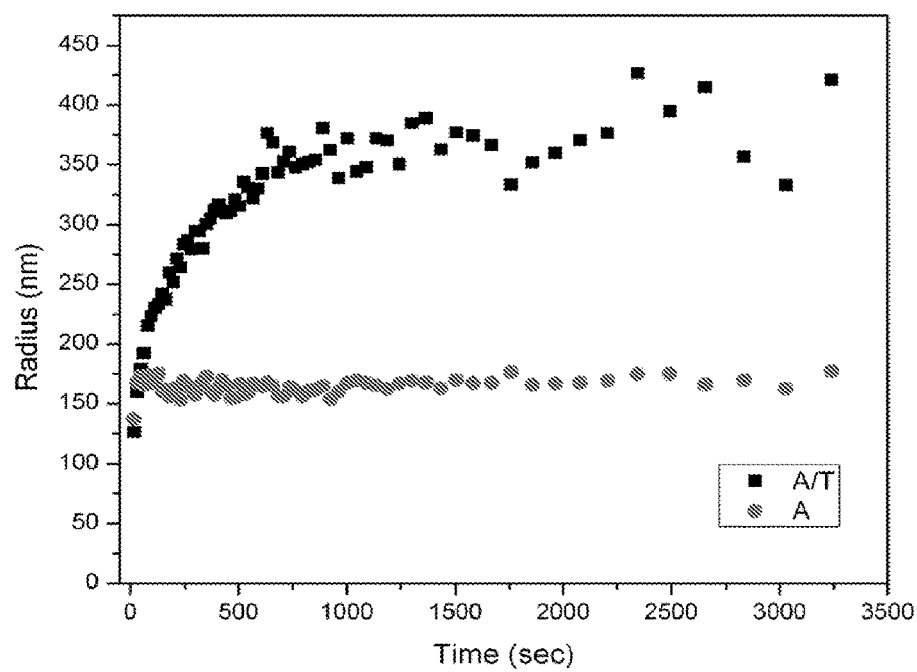
FIG. 16 is a plot of the radius of anthracene and anthracene-TCNQ versus time when reprecipitated in water.

DLS measurements for the 7.5 mM concentration of anthracene and anthracene-TCNQ were performed to further investigate formation of a co-crystal. FIG. 16 shows the average radius of the particles in each solution. There is a sizable difference between the anthracene-only average particle radius and the anthracene-TCNQ average radius, which can indicate the formation of a co-crystal similar to the perylene-TCNQ co-crystal. In some embodiments, additional measurements using, e.g., Raman spectroscopy, Powder X-ray diffraction, SEM, as well as electrical testing, can be conducted.

Example 3: TTF-TCNQ

Figure 17:
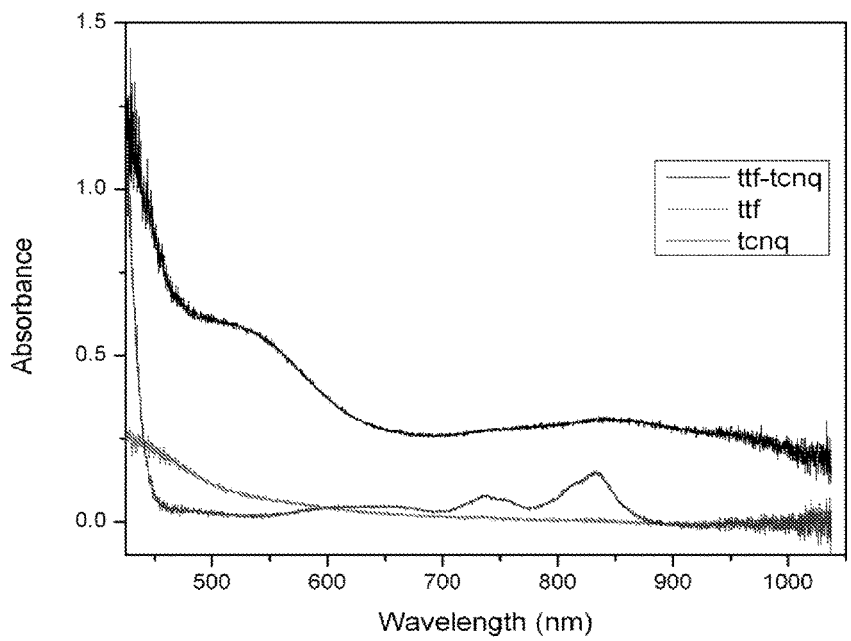
FIG. 17 is a plot of the absorption spectra of TTF-TCNQ at a concentration of 2.5 mM and a ratio of 1:9 with distilled water.

In a third example, TTF-TCNQ was also tested to see if the co-crystal could form using the reprecipritation method with acetone and water. The UV-Vis absorption spectra of TTF, TCNQ, and TTF-TCNQ, all at 2.5 mM concentrations, is shown in FIG. 17. An absorption band is shown at about 525 nm for TTF-TCNQ that does not exist in either the TTF or TCNQ absorption spectra. An extension of the 825 nm absorption band of TCNQ to a slightly longer wavelength is also shown. Such absorption bands can be indicative of the formation of a co-crystal. Since TTF reacts highly with air and water, measurements can be done under a nitrogen atmosphere. In some embodiments, additional measurements using, e.g., Raman spectroscopy, Powder X-ray diffraction, SEM, as well as electrical testing, can be conducted.

Example 4: Tetracene-TCNQ

In a fourth example, Tetracene-TCNQ was tested to see if the co-crystal could form using the reprecipitation method. Since it is more difficult for tetracene to dissolve in acetone, Tetracene-TCNQ was tested at 0.3 mM concentrations for 1:9 and 1:2 ratios. However, no absorption bands were detected for TCNE for the 2.5 mM concentration for UV-Vis or NIR. In some embodiments, additional measurements using, e.g., Raman spectroscopy, Powder X-ray diffraction, SEM, as well as electrical testing, can be conducted.

Example 5: Characterization of Charge Transfer Salts Using the Reprecipitation Method In a fifth example, devices and methods for characterization of charge transfer complexes made using the reprecipitation method are disclosed.

The reprecipation method is the process in which nanoparticle nucleation and growth is induced by the rapid injection of a molecular solution into a miscible non-solvent. In some embodiments, the reprecipitation method can be used for multicomponent organic nanoparticle synthesis. In the case of multicomponent organic nanoparticle synthesis with the reprecipitation method, compounds can be mixed in identical solutions such as acetone or ethanol. After mixing the two or more solutions at a specified ratio, the combined solution can be injected into a non-solvent. To avoid mixing with the non-solvent, the compounds can aggregate in the solution to create nanoparticles. Analysis of multicomponent nanoparticles using the reprecipitation technique can be difficult since the crystallization of all components involves the interactions of all compounds as well as the solvents.

Organic co-crystal nanoparticles including organic charge transfer salts or organic charge transfer complexes can be useful for organic electronic devices such as OFETs and OPVs. An organic charge transfer complex can be a combination of a donor and an acceptor molecule, either both organic or an organic/non-organic combination. Organic charge transfer complexes can exhibit a strong ability to transfer electron charge within the crystal. Additionally, organic charge transfer complexes can have strong electron and hole mobilities.

In photovoltaic devices, electromagnetic radiation of short wavelength and high frequency (like ultraviolet radiation) can be absorbed by the semiconductor material, which can cause photoexcitation of electrons and the creation of holes. When light hits the organic polymer of the organic solar cell, electrons can be excited to the Lowest Unoccupied Molecular Orbit (LUMO), which can leave holes in the Highest Occupied Molecular Orbit (HOMO). In a single layer OPV, an electric field can be produced by the different work functions of the electrodes to achieve charge separation. In a bilayer OPV, in which there are layers of electron donor and electron acceptor polymers, or in a bulk hetero junction, in which the two donor and acceptor polymers are blended, the difference in donor and acceptor electric fields separate the exciton pairs. In all three OPVs, as the potential separates the exciton pairs, the charge is carried through the material and creates a current.

One of the largest problems in organic solar cells can be the inefficiency of the charge transfer through the organic polymer materials to the electrodes to create energy. The charge carrier mobility of organic compounds can be much lower than inorganic compounds, and the interaction of the electron hole pair can result in diffusion as uncharged particles. Organic charge transfer complexes, with their high charge carrier mobility and charge transfer, have the ability to optimize current OPVs as well as other organic semiconductor devices, such as field effect transistors and light emitting diodes. If current OPVs are doped with organic charge transfer complexes, their charge mobility and transfer can be enhanced and, therefore, the organic solar cell can be more efficient.

The materials described in this example are listed in the tables of FIGS. 1 and 2. For donor compounds, perylene, anthracene, tetracene and tetrathiafulvalene (TTF) can be used. For acceptor compounds, in order to form charge transfer complexes, Tetracyanoquinodimethane (TCNQ) and Tetracyanoethylene (TCNE) can be used. In general, the donor and acceptor molecules combine to form organic charge transfer complexes, which can be configured as multicomponent organic nanoparticles.

Perylene-TCNQ co-crystals can be formed using the reprecipitation technique. When perylene crystallizes with a molecule of the cyano family (—CN), of which both acceptor molecules TCNQ and TCNE are a part, the crystal can exhibit high electron and hole mobilities, while tetracene-TCNQ can have slightly lower mobilities.

Samples can be prepared using the reprecipitation method, similar to the method described with respect to FIGS. 3A-3C. Typically, compounds are prepared in acetone with a concentration of 2.5 mM; however, tetracene does not dissolve in acetone very easily and, therefore, can be prepared at 0.3 mM (and a TCNQ solution at the same concentration). Molecular solutions in acetone can be mixed using a microsyringe in a beaker at equimolar concentrations. The mixed acetone solution can then be rapidly injected using the microsyringe into distilled water at a typical 1:9 ratio (acetone solution and water), although other ratios are possible. Single component acetone solution nanoparticles can be assembled using the same technique for comparison.

If the powder form of the nanoparticles is desired, after a period of time to allow for nanoparticle growth (e.g., 30 minutes), the container of solution can be submerged in liquid nitrogen. This can allow an almost immediate freezing of the solution and can relatively quickly stop nanoparticle growth. The container can then be placed in a Virtis Vacuum lyophilizer at −70 degrees Celsius. In some embodiments, the powder can be ready in a couple of weeks.

To determine if organic co-crystal charge transfer complex nanoparticles are forming, a number of optical characterization techniques can be utilized. Absorption Spectroscopy can be particularly useful to determine co-crystal structure in organic charge transfer complexes because of the combined unique properties that are shown in the formation of new absorption bands. Other optical characterization technique to verify co-crystal formation and particle growth used is Dynamic Light Scattering.

Absorption spectra are obtained from a mini spectrophotometer, such as an Ocean Optics CHEM2000-UV-VIS, which measures the amount of light absorbed by the solution between the wavelengths 350 nm to 1000 nm. A solution of water and acetone at the same ratio as the ratio being measured can be used as a reference. Spectrophotometers, optical fibers, and filters can be used in combination to detect signals in or near the infrared region.

Dynamic Light Scattering (DLS) can be used to determine the particle size as a function of time to witness the particle growth formation. A 10 mW HeNe laser (JDS Uniphase 1202-1) can excite the sample in solution and an optical fiber coupled to an avalanche photodiode detector (e.g., a Perkin Elmer SPCM CD2882) can measure the amount of scattered light at 90 degrees.

To determine the conductivity and photoconductivity of samples, the particles can be spin coated onto microscope slides (using, e.g., a Photo Resist Spinner PWM32) in a mixture of polyvinylpyrrolidone and de-ionized water. The solution can be spin coated for 35 seconds at 1000 rpm with a slow spread at the beginning for 5 seconds. This recipe allows for an even spread across the entire microscope slide. Nanoparticles and polyvinylpyrrolidone can be set at a 1:1 ratio and for every gram of nanoparticles and gram of polyvinylpyrrolidone, there can be 5 mL of de-ionized water. After the nanoparticles have been spin-coated, the height of the spun material can be measured using a surface profilometer, such as a Dektak 3030 Surface Profilometer. In some embodiments, the sample can be evenly spread and have a height of about 7500 Å. In some embodiments, a piece of tape can cover the end of the microscope slide to determine the height of the microscope slide.

The conductivity of the organic charge transfer complex can show how strongly the sample allows the flow of current, which can give a good determination of the charge mobility in the material. Using a computer with, e.g., a NI pci-6221 M-series DAQ card, an SCB breakout box, a high stability pre-amp and a voltage sweeper, a current can be applied across the sample and two probes can measure the voltage difference across a small distance. In this type of measurement, the sample can be spun directly onto the microscope slide after the probes are attached to the slide.

Another technique that can be employed can include 2 kÅ of aluminum sputtered on the microscope using a sputtering system, such as a CVC AST-601 sputtering system, followed by the spun cast sample, followed by another 2 kÅ of aluminum. In a two point probe procedure, a probe can be placed on each aluminum probe pad to measure the voltage difference when a current is applied.

After measuring the I-V curves, the resistivity of the sample can be calculated using equation (11):

$$\rho = (R*A)/l \tag{11}$$

where R is the resistance (the slope of the I-V curve), A is the cross sectional area and l is the length of the sample. From that, the conductivity of the sample can be determined using equation (12):

$$\sigma = 1/\rho \tag{12}$$

Photoconductivity can measure how much the conductivity changes in the material due to the absorption of light. While the conductivity can be useful for applications of various organic semiconducting devices, photoconductivity can be useful for organic photovoltaics if the charge mobility of the material increases in the presence of sunlight.

Figure 18:
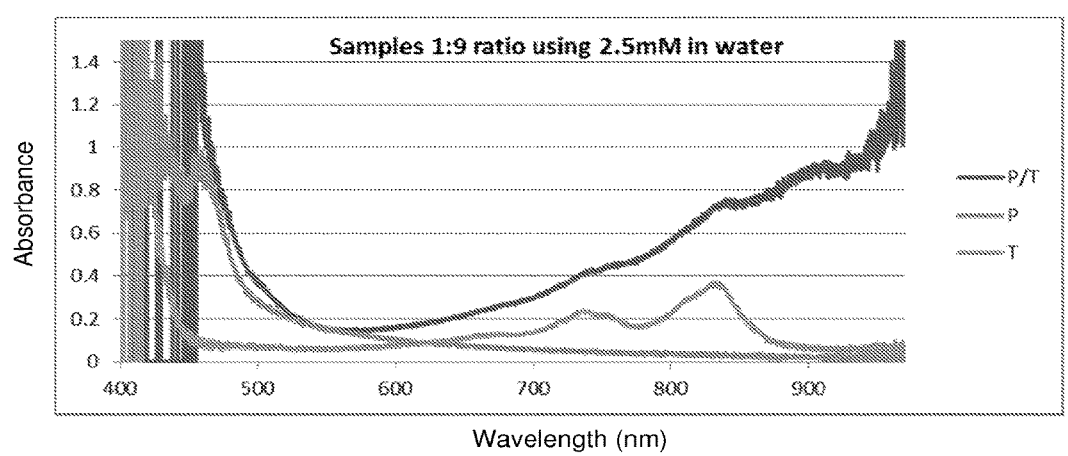
FIG. 18 is a plot of the absorption spectra of perylene and TCNQ separately and together in distilled water at a ratio of 1:9.

To verify the co-crystallization of perylene and TCNQ, the absorption spectrum can be measured for a 1:9 ratio. Results are shown in FIG. 18. Additionally, various ratios from 1:7 to 3:1 can be measured to see at which point the co-crystal stops forming.

Figure 19:
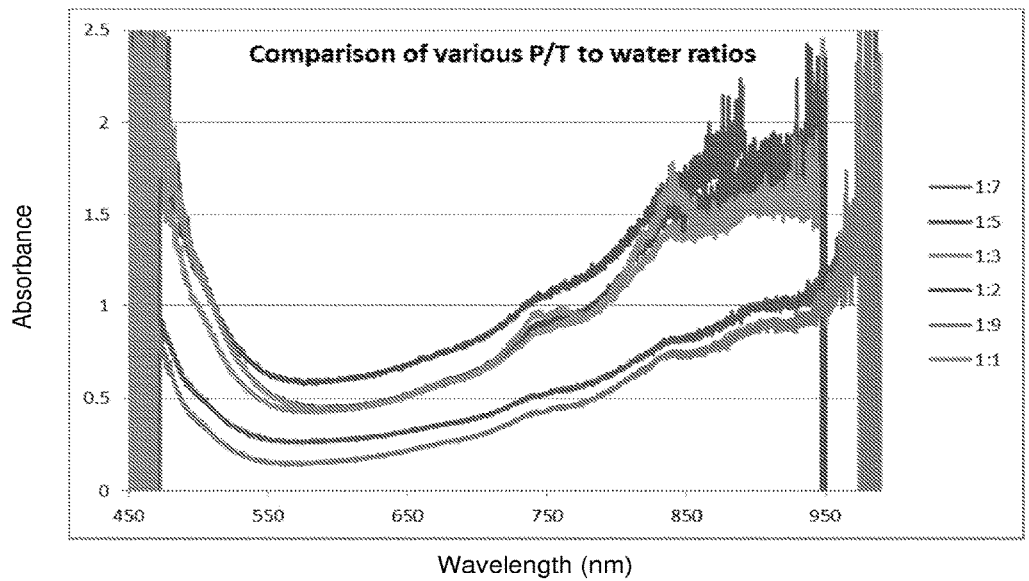
FIG. 19 is a plot of the absorption spectra for various ratios of perylene-TCNQ in distilled water.

With reference to FIG. 19, the absorption spectra for perylene-TCNQ at a ratio of 1:9 had a new peak around 900 nm, which can indicate co-crystallization. A peak around 900 nm can be observed for all ratios between 1:9 and 1:1 (acetone to water). It also seems that the 1:5 ratio has the highest peak and that the 1:9 and 1:7 have the lowest. For ratios of 2:1 and 3:1, no light is absorbed since the solution is opaque, and large particles can form in solution. A new peak in the perylene-TCNQ that does not correspond to the peaks in either perylene-only or TCNQ-only solutions in water can indicate that a new co-crystal may be forming. In some embodiments, the co-crystal can form for the ratios up to between 1:2 and 1:1 (acetone solution to water).

Figure 20:
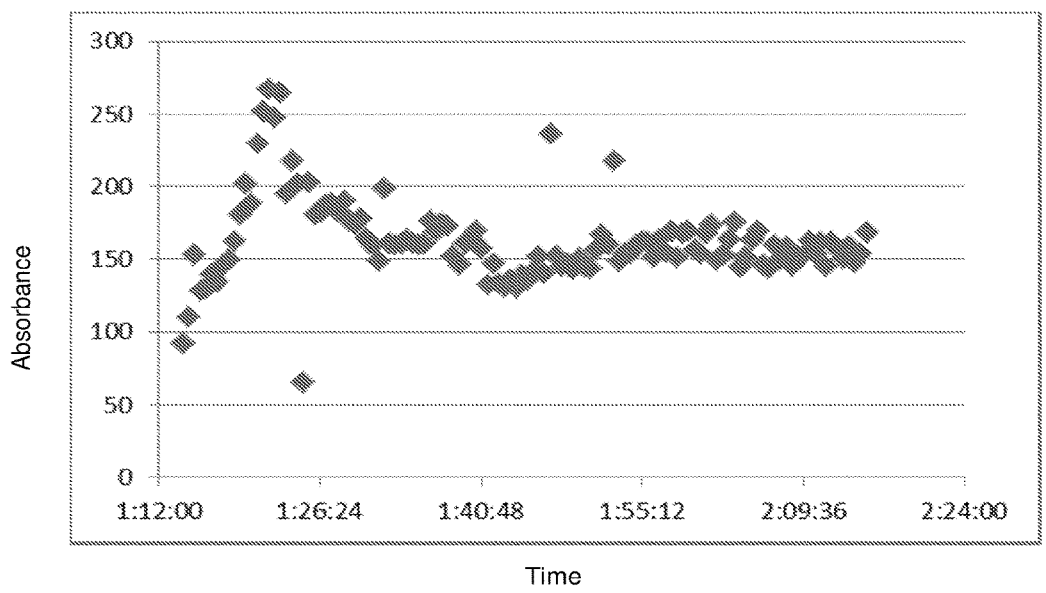
FIG. 20 is a plot of Dynamic Light Scattering data showing the radius of perylene-TCNQ molecules with respect to time.

TCNQ can potentially form large structures. Once the particle's radius increases past about 200 nanometers, the DLS setup can be inaccurate. Thus, when the average radius of the solutions goes past the 200-350 nm range, TCNQ-only particles may be forming and the co-crystal may no longer form. FIG. 20 shows that the radius is continuously increasing and not leveling off after an hour. Therefore, between the 1:1 and 2:1 ratios, the co-crystal may stop forming.

For the ratios from 1:9 to 1:1, there can be a small increase in average radius of the particles. For the 1:9 ratio, the average radius can level off at 150 nm; for the 1:7 ratio, at 200 nm; for the 1:5 and the 1:3 ratios, at 250 nm; for the 1:2 and the 1:1 ratios, at 275 nm. There can be a slight correlation of particle radius to the ratio of acetone solution to water.

Figure 21:
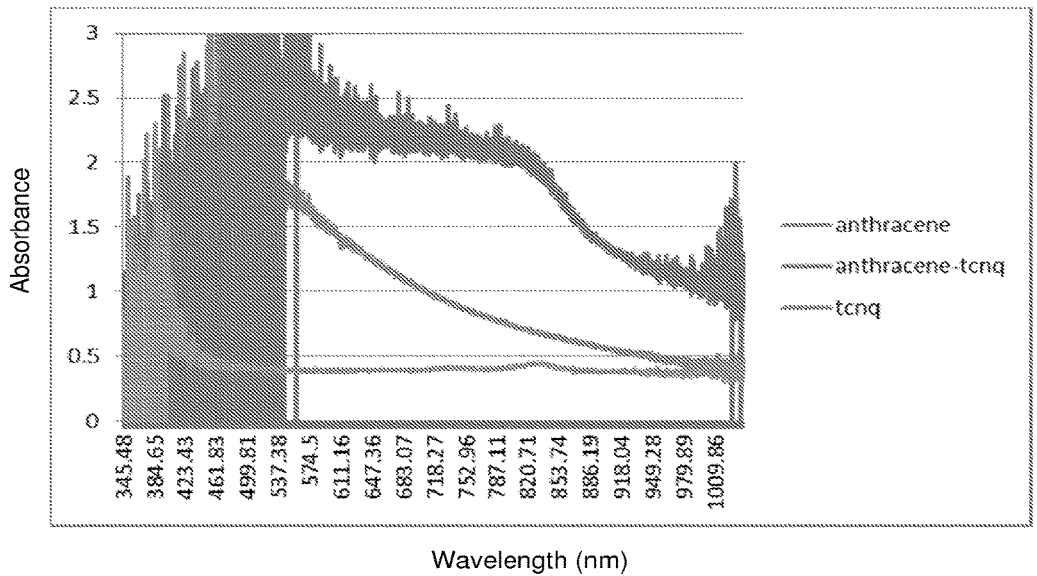
FIG. 21 is a plot of the absorption spectra of anthracene-TCNQ at a concentration of 7.5 mM and a ratio of 1:9 with distilled water.

Anthracene-TCNQ was tested at 2.5 mM concentrations at ratios of 1:9 and 1:4 with distilled water, at 7.5 mM concentrations with a 1:9 ratio, and a combination of 2.5 and 7.5 mM concentrations with 1:9 ratios. As shown in FIG. 21, the absorption spectra of the combined anthracene-TCNQ acetone mixture in water may not show any new peaks. The absorption peaks of the combined acetone mixture may be the combination of the absorption peaks of the acetone solutions separately. However, the absorption spectrum of anthracene-TCNQ at 7.5 mM has a peak around 800 nm and, in some embodiments, there may be a peak in the near infrared region.

Since it is more difficult for tetracene to dissolve in acetone, tetracene-TCNQ can be tested at 0.3 mM concentrations for 1:9 and 1:2 ratios.

As stated previously, conductivity and photoconductivity measurements of perylene-TCNQ can be undertaken.

The organic compounds TCNE and TTF react highly in air and water and, therefore, the absorption spectra may be prepared while under a nitrogen atmosphere.

Potential co-crystal combinations can be verified using, for example, DLS, Raman Spectroscopy, Powder X-Ray Diffraction, and SEM. In some embodiments, samples can be freeze-dried and the conductivity and photoconductivity tested.

With the growing concern for the adverse effects of climate change, alternatives to fossil fuel energy must be implemented. Solar energy is a viable alternative, and with more technological advances, organic photovoltaic devices would be less expensive, can be flexible, and can be easier to dispose than traditional inorganic photovoltaic devices. Organic charge transfer complexes made of acceptor and donor compounds described herein have the potential to optimize the charge mobility and transfer in OPV devices. Organic transfer complex nanoparticles created using the reprecipitation method are presented in this disclosure.

Accordingly, the embodiments described herein can display the following advantages.

Organic nano-co-crystals (e.g., multicomponent organic nanoparticles) can be useful for optoelectronic devices such as, without limitation, photovoltaic cells, light emitting diodes, and devices based on molecular electronics, such as organic transistors. Most of these devices can be primarily composed of organic materials. The organic nano-co-crystals disclosed herein can have electronic and optical properties well suited to at least the device categories generally described herein. In some embodiments, the organic nano-co-crystals disclosed above can have particle radii ranging from about 30 nm to about 1000 nm or greater. In other embodiments, the organic nano-co-crystals can have particle radii ranging from about 90 nm to about 150 nm.

The materials, devices and methods disclosed herein can be used as additives in electronic devices to improve their properties. In particular, conductivity for both positive (holes) and negative (electrons) charge carriers, low band gaps, and efficient charge separation can be improved. The organic nano-co-crystals described herein can also be embedded into bulk heterojunction devices in order to improve the free charge generation and transport in photovoltaics, or the charge transport and recombination in light emitting diodes.

Good conductivity for both positive and negative charge carriers is needed for electronic and optoelectronic devices. In many cases, this can be achieved by separate constituents to enhance the conductivities of each charge species. Materials possessing good transport properties for both electrons and holes, such as the charge transfer molecular crystal perylene-TCNQ, can be available as bulk crystals. This disclosure is directed to the application of the nanocrystal form of such crystals for optoelectronic devices. The charge transport properties of the organic nano-co-crystals can be characterized. This can include creating single layer films of the crystals embedded in a polymer matrix and the characterization of the conductivities. In addition, other variations of the charge transfer nanocrystals, such as tetrathiafulvalene-TCNQ can be synthesized.

Organic electronics have many applications such as organic field effect transistors, optical communication devices, advanced display technology and organic photovoltaic devices. Organic charge transfer complexes made of acceptor and donor compounds have the potential to optimize the charge mobility and transfer in these devices. Organic charge transfer complex nanoparticles created using the reprecipitation method, especially perylene-TCNQ, can improve these devices.

Additionally, in some embodiments, the organic charge transfer complexes disclosed above can be useful for organic photovoltaic devices. In a representative embodiment, an organic photovoltaic device can be doped with an organic charge transfer complex. The organic charge transfer complex can comprise one or more electron donor molecules or particles and one or more electron acceptor molecules or particles, which can associate as nanoparticle co-crystals. In some embodiments, the electron donor particle can be selected from, for example, perylene, anthracene, tetracene and tetrathiafulvalene. In some embodiments, the electron acceptor particle can be selected from, for example, tetracyanoquinodimethane and tetracyanoethylene. In some embodiments, the radius of the nanoparticle co-crystal can be from about 30 nm to about 1000 nm. In additional embodiments, the radius of the nanoparticle co-crystal can be from about 90 nm to about 150 nm.

In view of the many possible embodiments to which the principles of the disclosure may be applied, it should be recognized that the illustrated embodiments are only preferred examples and should not be taken as limiting the scope of the disclosure. Rather, the scope of the disclosure is defined by the following claims.

What is claimed is:

1. A method of making an organic field effect transistor, comprising:
    mixing a first solvent solution containing perylene with a second solvent solution containing tetracyanoquinodimethane to obtain perylene-tetracyanoquinodimethane nanoparticles, the mixing being performed in a third non-solvent solution in which neither perylene nor tetracyanoquinodimethane are soluble, resulting in a fourth solution;
    lyophilizing the fourth solution to remove the fourth solution from the perylene-tetracyanoquinodimethane nanoparticles;
    catching perylene-tetracyanoquinodimethane nanoparticles ejected during lyophilization of the fourth solution with a covering, the covering comprising a first film layer comprising holes and a second film layer to catch nanoparticles ejected during outgas sing of the nanoparticles;
    providing a semiconductor substrate having an insulating layer thereon;
    depositing a source electrode and a drain electrode onto the insulating layer such that the source electrode and the drain electrode define a channel region therebetween; and
    depositing an organic semiconductor layer in the channel region by spin coating a mixture comprising a liquid polymer and an organic semiconductor onto the semiconductor substrate, the organic semiconductor comprising an organic charge transfer complex including multicomponent organic nanoparticles, the multicomponent organic nanoparticles comprising perylene-tetracyanoquinodimethane nanoparticles obtained in the lyophilizing step; and
    drying the spin-coated mixture to form a film comprising perylene-tetracyanoquinodimethane nanoparticles embedded in a polymer matrix.

2. The method of claim 1, wherein the multicomponent organic nanoparticles further comprise nanoparticles including:
    an electron donor compound selected from anthracene, tetracene and tetrathiafulvalene; and
    an electron acceptor compound selected from tetracyanoquinodimethane and tetracyanoethylene.

3. The method of claim 1, wherein the multicomponent organic nanoparticles have radii of from about 30 nm to about 1000 nm.

4. The method of claim 1, wherein the multicomponent organic nanoparticles have radii of from about 90 nm to about 150 nm.

5. The method of claim 1, wherein depositing the organic semiconductor layer in the channel region further comprises spin coating the liquid polymer and perylene-tetracyanoquinodimethane nanoparticles mixture on the semiconductor substrate such that the mixture at least partially coats the source electrode and the drain electrode.

6. The method of claim 1, further comprising after mixing the first solvent solution with the second solvent solution and the third non-solvent solution, freezing the resulting fourth solution to stop growth of the perylene-tetracyanoquinodimethane nanoparticles.

7. The method of claim 6, wherein:
the perylene-tetracyanoquinodimethane nanoparticles and the fourth solution are contained in a container; and
catching the perylene-tetracyanoquinodimethane nanoparticles further comprises covering the container with the covering.

8. The method of claim 6, wherein:
the first solvent solution comprises acetone;
the second solvent solution comprises acetone;
the third non-solvent solution comprises water; and
a ratio of the first and second acetone solvent solutions to the third non-solvent water solution is 1:9.

9. The method of claim 1, wherein the liquid polymer comprises polyvinylpyrrolidone.

10. The method of claim 9, wherein a ratio of the mass of perylene-tetracyanoquinodimethane nanoparticles to the mass of polyvinylpyrrolidone is 1:1.

11. The method of claim 9, wherein:
the mixture further comprises water; and
for every 5 mL of water, the mixture comprises one gram of perylene-tetracyanoquinodimethane nanoparticles and one gram of polyvinylpyrrolidone.

12. The method of claim 1, wherein the film comprising the perylene-tetracyanoquinodimethane nanoparticles embedded in the polymer matrix has a height of about 7500 Å.

13. The method of claim 1, further comprising at least partially covering the semiconductor substrate with tape when depositing the liquid polymer and perylene-tetracyanoquinodimethane nanoparticle mixture.

14. The method of claim 1, wherein the film comprising perylene-tetracyanoquinodimethane nanoparticles embedded in a polymer matrix at least partially covers the source electrode and the drain electrode.

15. The method of claim 1, wherein depositing the source electrode and the drain electrode further comprises:
depositing a first metal layer of the source electrode and a first metal layer of the drain electrode on the insulating layer; and
depositing a second metal layer of the source electrode on the first metal layer of the source electrode, and a second metal layer of the drain electrode on the first metal layer of the drain electrode.

16. The method of claim 15, wherein:
the first metal layers of the source electrode and the drain electrode comprise chromium; and
the second metal layers of the source electrode and the drain electrode comprise gold.

17. The method of claim 15, wherein a ratio of the thickness of the second metal layer of the source electrode to the thickness of the first metal layer of the source electrode is about 30:1.

* * * * *

UNITED STATES PATENT AND TRADEMARK OFFICE
CERTIFICATE OF CORRECTION

PATENT NO. : 10,374,198 B2
APPLICATION NO. : 15/038658
DATED : August 6, 2019
INVENTOR(S) : Van Keuren et al.

Page 1 of 1

It is certified that error appears in the above-identified patent and that said Letters Patent is hereby corrected as shown below:

In the Claims

Column 18, Line 41, "outgas sing" should read -- outgassing --.

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*